United States Patent
Haas

(10) Patent No.: US 10,700,698 B2
(45) Date of Patent: Jun. 30, 2020

(54) LINEARIZATION CIRCUIT AND METHOD FOR LINEARIZING A MEASUREMENT SIGNAL

(71) Applicant: MICRO-EPSILON MESSTECHNIK GMBH & CO. KG, Ortenburg (DE)

(72) Inventor: Harald Haas, Ruhstorf a.d. Rott (DE)

(73) Assignee: Micro-Epsilon Messtechnik GMBH & Co. KG, Ortenburg (DE)

( * ) Notice: Subject to any disclaimer, the term of this patent is extended or adjusted under 35 U.S.C. 154(b) by 0 days.

(21) Appl. No.: 16/469,326

(22) PCT Filed: Dec. 7, 2017

(86) PCT No.: PCT/DE2017/200130
§ 371 (c)(1),
(2) Date: Jun. 13, 2019

(87) PCT Pub. No.: WO2018/108216
PCT Pub. Date: Jun. 21, 2018

(65) Prior Publication Data
US 2020/0021306 A1    Jan. 16, 2020

(30) Foreign Application Priority Data

Dec. 14, 2016   (DE) .................. 10 2016 225 044

(51) Int. Cl.
*H03M 1/58*     (2006.01)
*G01K 7/14*     (2006.01)
(Continued)

(52) U.S. Cl.
CPC ............. *H03M 1/58* (2013.01); *G01K 7/14* (2013.01); *G01R 15/005* (2013.01); *H03M 1/504* (2013.01)

(58) Field of Classification Search
CPC ...... H03M 1/58; H03M 1/504; G01R 15/005; G01K 7/14
(Continued)

(56) References Cited

U.S. PATENT DOCUMENTS

| 3,277,395 A | 10/1966 | Grindle et al. |
| 3,460,068 A | 8/1969 | Lechleider |

(Continued)

OTHER PUBLICATIONS

Lygouras J N: "Non-linear analogue-to-digital conversion through PWM", International Journal of Electron, Taylor and Francis Ltd. London, GB, Bd. 62, Nr. 3, Mar. 1987 (Mar. 1987), Seiten 347-352, XP007901127, ISSN: 0020-7217.
(Continued)

*Primary Examiner* — Khai M Nguyen
(74) *Attorney, Agent, or Firm* — Jason P. Mueller; FisherBroyles, LLP

(57) ABSTRACT

A disclosed linearization circuit includes a reference component, a charging and discharging controller, and a comparator circuit. The reference component has a non-linear dependence on current or voltage. The charging and discharging controller is configured to control alternating charging and discharging of the reference component. A voltage associated with the reference component forms a reference signal. The charging and discharging are controlled such that the reference signal has a periodic time dependence. The reference signal and a measurement signal are received by the comparator circuit. The comparator circuit is configured to generate and output a square-wave signal based on a reference time point during a charge-discharge cycle, and based on a result of a comparison of the reference signal with the measurement signal, such that the square-wave signal represents a linearized output signal. This disclosure further relates to a corresponding method.

19 Claims, 9 Drawing Sheets

(51) Int. Cl.
*G01R 15/00* (2006.01)
*H03M 1/50* (2006.01)

(58) Field of Classification Search
USPC .................. 341/140, 143, 155, 169; 324/678
See application file for complete search history.

(56) References Cited

U.S. PATENT DOCUMENTS

| | | | |
|---|---|---|---|
| 3,691,473 | A | 9/1972 | Boatwright |
| 6,339,352 | B1 | 1/2002 | Cosan et al. |
| 7,288,946 | B2 * | 10/2007 | Hargreaves ........ G01R 27/2605 |
| | | | 324/678 |
| 8,564,313 | B1 * | 10/2013 | Ryshtun ............... H03K 17/962 |
| | | | 324/678 |
| 2009/0278545 | A1 | 11/2009 | Magana et al. |

OTHER PUBLICATIONS

Dias-Pereira et al.: "A Digitally Programmable A/D Converter for Smart Sensors Applications", Horological Jornal, Horological Journal. Ashford, GB, Bd. 7 16. May 16, 2005 (May 16, 2005), Seiten 156-159, XP001508959, ISSN: 0018-5108.

* cited by examiner

LINEARIZATION CIRCUIT AND METHOD FOR LINEARIZING A MEASUREMENT SIGNAL

CROSS-REFERENCE TO RELATED APPLICATIONS

This application is a national stage entry under 35 U.S.C. 371 of PCT Patent Application No. PCT/DE2017/200130, filed Dec. 7, 2017, which claims priority to German Patent Application No. 102016225044.2, filed Dec. 14, 2016, the entire contents of each of which are incorporated herein by reference.

This disclosure relates to a linearization circuit for linearizing a measurement signal, wherein the linearization circuit has an input for inputting the measurement signal and an output for outputting a linearized output signal. This disclosure further relates to a respective method.

It is common practice to measure a physical variable, such as a distance, a position, a temperature, a wavelength, a lighting intensity, a (magnetic or electric) field strength, or a force, and convert it into an electric signal. This electric signal—the measurement signal—can then be further processed using an electric circuit. To this end, it is often important that there is a linear relationship between the physical variable and the measurement signal. This implies that the measurement signal also changes in a linear manner when the physical variable undergoes a linear change. Such a linear relationship makes a utilization of the measurement signal considerably easier.

The sensors or sensor arrangements used for such measurements frequently do not have linear characteristic curves, i.e. the measurement signal is in a non-linear relationship with the physical variable. In this case, the measurement signal must be linearized. In most cases, this requires a considerable hardware and/or software outlay.

Linearization hardware often consists in so-called logarithmic amplifiers, whose amplification varies as a function of input voltage. The disadvantage of such circuits is that they are based on a pair of transistors whose characteristic curves and temperature behaviors must deviate from each other as little as possible. Such pairs are expensive, hard to get, and large in size. In addition, extra temperature compensation of the pair of transistors is required to keep the temperature error of the circuit within specific limits.

Also, multiple operational amplifiers must be used whose noise, temperature drifts, and offset voltages must be low. Also required are precision resistors with low tolerances and temperature drifts as external circuitry. Such a circuit causes considerable costs.

If the measurement signal is to be linearized using software, fast and precise analog-to-digital converters are required. The analog-to-digital converter must have as great a number of bits as possible to obtain sufficiently good results, for example, in the flat region of the characteristic curve. After conversion, there are two common methods to linearize the digitized signal:

by use of a higher-order polynomial, which requires an accordingly fast computer, or by use of so-called lookup tables, which require respective memory space and must be completely recalculated for minor changes of the raw signal.

It is a disadvantage of both approaches that resolution drops as the raw signal flattens, since the digitization leaps of the analog-to-digital converter remain the same. In addition, conversion is often very slow.

It is therefore the problem of the disclosure to design and develop a linearization circuit and a method of the type mentioned above, such that a linearized output signal or a signal representative of a linearized output signal can be generated with as little effort as possible and at as low cost as possible.

The above problem is solved according to the disclosure by various embodiments. For example, a disclosed linearization circuit includes:

a reference component having a non-linear dependence on current or voltage, wherein the voltage across the reference component or a voltage derived from a current flowing through the reference component forms a reference signal ($U_c$) or an alternating component of a reference signal ($U_c$), a charging and discharging controller configured to control alternating charging and discharging of the reference component, wherein the charging and discharging are controlled in such a manner that the reference signal ($U_c$) has a substantially periodic curve, a comparator circuit having a first input, a second input, and an output, wherein the reference signal ($U_c$) is applied to the first input and the measurement signal ($U_d$) is applied to the second input, and wherein the comparator circuit is configured to generate and output at the output thereof a square-wave signal ($U_a$) on the basis of a reference time during a charge-discharge cycle and a result of a comparison of the reference signal ($U_c$) with the measurement signal ($U_d$), so that the square-wave signal represents a linearized output signal.

The above problem with respect to a method is solved according to the disclosure by various embodiments. For example, a respective method includes the following stages:

Alternating charging and discharging of a reference component for generating a reference signal ($U_c$), which depends on a voltage applied to the reference component or on a current flowing through the reference component, wherein the charging and discharging of the reference component is controlled such that the reference signal ($U_c$) has a periodic curve, Inputting the reference signal ($U_c$) into a first input of a comparator circuit of the linearization circuit, Inputting the measurement signal ($U_d$) into a second input of the comparator circuit, Generating a square-wave signal ($U_a$) based on a reference time during a charge-discharge cycle and a result of a comparison of the reference signal ($U_c$) with the measurement signal ($U_d$) by the comparator circuit, and Outputting the square-wave signal ($U_a$) from the linearization circuit as a linearized output signal.

According to the disclosure, it was first realized that non-linear characteristic curves of sensors or sensor arrangements are often curves which have a slope that declines in amount. The slope of the characteristic curves of many non-linear sensors or sensor arrangements—both in the ascending and in the descending portions of the characteristic curve—are greater in amount in the lower region of the measuring range and therefore provides a higher sensitivity than in the upper region. The characteristic curve flattens increasingly towards the upper end of the measuring range. It was further found that electronic components having a non-linear dependence on voltage or current show a very similar behavior. Such components are, for example, a capacitance (capacitor) or an inductance (coil).

A non-linear dependence on voltage or current implies that the voltage across, or the current flowing through, the component changes non-linearly at a constant excitation. This will be illustrated in greater detail with reference to an exemplary capacitor and coil. When applying a direct voltage $U_b$ of constant excitation, the voltage $U_c$ across the capacitor follows the equation:

$$U_C < U_b \cdot (1 - e^{-t/\tau})$$

Wherein τ is a time constant which increases exponentially with the voltage $U_c$ and depends on the magnitude of the capacitance and the resistor across which the capacitance is charged.

This applies accordingly to a current flowing through a coil and a voltage drop $U_c$ at a resistor R caused by it. The curve of the voltage drop $U_c$ at the resistor R caused by the current flowing through the coil satisfies the following equation when a direct voltage $U_b$ is applied:

$$U_C = R \cdot I_0 \cdot (1 - e^{-t/\tau}) \text{ where } I_0 = \frac{U_b}{R_L}$$

$R_L$ is the ohmic resistance of the coil and τ is a time constant at which the current flowing through the coil rises exponentially.

According to the disclosure, it was further found that precisely this behavior of electronic components with a non-linear dependence on voltage or current can be utilized to achieve linearization of non-linear measurement signals. Indeed, many non-linear sensors have a comparable curve, such as the charging curve of a capacitance or the current draw of an inductance. Therefore, such an electronic component is used as a reference component to generate a reference signal. The reference signal may be the voltage dropping across the reference component. Alternatively, the voltage which is dropping across the reference component may form an alternating component of the reference signal. If the reference component is a current-controlled component, such as a coil, the current can be used to generate the reference signal, for example by converting the current flow into a respective voltage drop. A resistor through which this current flows can be used to this end. The derived voltage can either form the reference signal itself or it can form the alternating component of the reference signal.

This reference signal is compared to the measurement signal. A periodic charging and discharging process is performed such that the comparison can be made not just one time. A charging or discharging process implies feeding in or removing power. In the case of a capacitor, this implies that an electric field is built up in said capacitor (charging) or the electric field is broken down (discharging). In a coil, a magnetic field would be built up (charging) or broken down (discharging).

A linearization circuit according to an embodiment which uses this effect includes a reference component, a charging and discharging controller, and a comparator circuit. The charging and discharging controller is configured to control alternating charging and discharging of the reference component. The charging and discharging are controlled in such a manner that the reference signal has a substantially periodic curve. In practice, this is achieved by starting a new charging process after a fixed period length T. The voltage across the reference component or a voltage derived from a current flowing through the reference component is used as reference signal or forms an alternating component of a reference signal. In the latter case, the voltage across the reference component or the voltage derived from the flowing current would be shifted by an offset.

The comparator circuit includes a first input, a second input, and an output. The reference signal is applied to the first input and the measurement signal is applied to the second input. The comparator circuit compares the reference signal to the measurement signal and produces a square-wave signal at its output based on the result of the comparison. Additionally, a reference time during a charge-discharge cycle is used. This creates a variable period of time which depends on the reference time and the time of changing a comparison result and which represents a linearized output signal. The greater the measurement signal, the later in a charging branch of a charge-discharge cycle changes the comparison result between the measurement signal and the reference signal. This compensates for the effect of flattening characteristic curves of the sensor or sensor arrangement due to the charging behavior of the reference component. The square-wave signal thus is a pulse width modulated output signal, which represents a linearization of the measurement signal.

A measurement signal, as used herein, is understood as a direct voltage which is dependent on the physical variable measured. Such a direct voltage is often directly present in non-linear sensors or sensor arrangements or can easily be generated. If, for example, the sensor or sensor arrangement includes an eddy current sensor whose frequency is dependent on the distance of a measured object, this frequency can easily be converted into a respective direct voltage. This assumption is not an actual limitation with respect to the teaching according to an embodiment.

A square-wave signal is considered an alternating signal which changes between a first level and a second level. The change between a first level and a second level is clearly smaller compared to the period length T of the square-wave signal. The level changes are typically performed in less than 1% of the period length. Preferably, a first level is a high level and a second level is a low level. The exact voltage values that a high or low level may have depends on the respective implementation of linearization circuit used. Common values for high levels are, for example, 3.3 volts or 5 volts, low levels often are at 0 volts.

The relationship between a charging phase and a subsequent discharging phase of the capacitor may take relatively arbitrary values as long as the charging phase lasts long enough and provides a sufficiently good resolution of the linearization and as long as the reference component is completely discharged at the start of a new charging phase. Where the reference component is formed by a capacitor, the capacitor would have to be completely discharged at the start of a new charging phase. If a coil is the implementation of the reference component, the coil would have to be completely de-energized at the start of a new charging phase. The relationship can be suitably selected based on the measurement signal, which depends on characteristics of the respective sensor. Preferably, the reference component is charged over at least 40% of the period length of a charge-discharge cycle. The discharging phase may take a maximum of 50% of the period length of a charge-discharge cycle, wherein discharging the reference component is typically completed faster than the discharge phase lasts. The charging phase and the discharging phase may have the same length.

Without limiting the generality of the disclosed embodiments, we will hereinafter substantially assume that the reference component is formed by a capacitance/a capacitor. Since the voltage drop during energizing and de-energizing a coil shows a similar non-linear behavior, a person skilled in the art will immediately recognize the transferability of these explanations from a capacitor to a coil or another reference component having non-linear dependence on current or voltage.

The comparator circuit can in principle be configured in the most varied ways. In this context, a square-wave signal can be generated whose level change is dependent on a reference time during a charge-discharge cycle and a result of a comparison of the reference signal and the measurement signal. Such circuits include, for example, splitter stages which receive their clock from stable quartz-based oscillators.

According to an embodiment of the comparator circuit, the circuit includes a comparator and a flipflop, however. The comparator once again includes first and second inputs, which are connected to the respective input of the comparator circuit. Accordingly, the reference signal would be applied to the first input of the comparator and the measurement signal to the second input of the comparator. The comparator itself compares the two signals applied to the first and second inputs, i.e. the reference signal and the measurement signal, and outputs the result to the flipflop. The flipflop generates the square-wave signal using the result of the comparison and outputs it via the output of the comparator circuit.

The comparator may be configured as an operational amplifier, which is connected as a Schmitt trigger. As a result, the comparator outputs either a first level or a second level. According to an implementation, the comparator outputs a low level when the reference signal is smaller than the measurement signal, while the comparator outputs a high level when the reference signal is greater than the measurement signal.

In a further embodiment of the flipflop, the flipflop is formed by a D flipflop. A D flipflop includes a data input (D), a clock input (CLK), and a reset input (R), wherein setting the output (Q) is triggered by a constant high level at the data input and an edge change from low to high level at the clock input. An activation event at the reset input results in resetting the flipflop. In practice, such an activation event is the exceeding of a predefined level—activation level—or an ascending edge of the applied signal. The flipflop is thus set in an edge-triggered manner. Resetting the flipflop is level-triggered, however, as soon as the activation level at the reset input is exceeded.

In an embodiment use of such a D flipflop, the clock input is connected to the charging and discharging controller. The flipflop would be adjusted to the charging and discharging controller such that the flipflop is set at the start of charging the capacitor, because a high level is continuously applied to the data input. In this manner, the flipflop would be set via the clock input at the same time when the capacitor is charged, such that it is very easy to form a reference time during a charge-discharge cycle, which is the start of charging the capacitor.

For the benefit of a comparison result of the comparator, the output of the comparator may be connected to the reset input of the D flipflop. The only prerequisite for such use is that the comparator can generate a signal that is suitable as an activation event for resetting the flipflop. This implies that, when changing the comparison result, the comparator either outputs a level change interpreted accordingly by the flipflop or a suitable level to the reset input of the flipflop. Such a connection of the D flipflop creates a square-wave signal at the output of the flipflop, which signal depends on a reference time and a result of a comparison of measurement signal and reference signal.

It should be noted that in an inverted triggering of the flipflop, the comparison result of the comparator can also be inputted into the set input.

Other types of flipflops, such as RS flipflops, can be used instead of a D flipflop. The flipflop circuitry must be adjusted such that the desired result is present at the output.

A simple AND gate may also be used instead of a D flipflop. A clock signal is applied to the first input of the AND gate, the comparison result from the comparator output is applied to the second input. In this embodiment it is beneficial if the comparator outputs a high level when the reference signal is smaller than the measurement signal. If the clock signal at the first input of the AND gate changes from low to high while at the same time a high level is applied to the output of the comparator, the output of the AND gate will be at a high level. As soon as the reference signal exceeds the measurement signal, the comparator switches to low level at its output. Thus a low level is applied to the second input of the AND gate, which causes the gate to switch to low at its output as well. The output of the AND gate remains at low level, even if the clock signal changes to low level. The duration of the high level at the output of the gate also depends on a reference time and a result of a comparison of measurement signal and reference signal.

It should be noted once again that there are many ways to design the comparator circuit which generate a square-wave signal at the output of the comparator circuit, which signal depends on a result of a comparison of measurement signal and reference signal.

In a further embodiment, the linearization circuit also includes first and second resistors, wherein the first resistor is configured for charging the capacitor and the second resistor is configured for discharging the capacitor. To achieve low temperature dependence of the charging process, the first resistor may be formed by a temperature-stable resistor. In principle, the second resistor could also have a temperature-stable design. But this is not absolutely necessary, since the comparison of the reference signal to the measurement signal is only performed during the charging phase, and the discharge branch is not used. Regardless of whether the second resistor is temperature-stable or not, it should be ensured that the discharging process of the capacitor is sufficiently fast. To this end, the second resistor is dimensioned relative to the first resistor such that the discharging of the capacitor is faster than the charging of the capacitor. This typically implies that the resistance value of the first resistor is greater than the resistance value of the second resistor. In a further embodiment, the first and second resistors may be dimensioned such that the time for charging the capacitor is at least twice as long as the time for discharging the capacitor, i.e. the capacitor is discharged twice as fast as the capacitor is charged.

To achieve adjustability of the linearization circuit to various measurement signals, the first resistor in a further developed embodiment may have an adjustable design. This can either be achieved by adjustability of the resistor itself or by connecting an adjustable resistor in parallel or in series to the first resistor. Such adjustability can be achieved, for example, by a digital-to-analog converter or by using a digital potentiometer which is connected in parallel or in series to the first resistor.

Another option for adapting the linearization circuit is changing the capacitance of the capacitor. This can be achieved by an adjustable capacitor, wherein it substantially does not matter if it can be adjusted mechanically (e.g. a trimming capacitor), electrically (e.g. a variable-capacitance diode), or digitally (e.g. by integrated circuits with a respective interface or by connecting or disconnecting capacitors). Accordingly, if a coil is used as a reference component, this coil may be implemented using an adjustable core. Generally speaking, the linearization circuit can be configured adjustably in that the reference component is adjustable. This is a way to influence the charging and discharging behavior.

Furthermore, there is an option to design the power source for charging, discharging, or both adjustably. This allows adjusting the circuit to any desired start and end values of the voltage $U_d$ to be linearized. There are numerous practical options, which are sufficiently known. For example, these may include potentiometers, power supply units, digital-to-analog converters, digital potentiometers, reference voltage sources, etc.

For performing charging and discharging processes, the linearization circuit may include a first switching device having at least one control input, a first input, a second input, and an output. The switching device may be configured such that it either connects the first input or the second input to the output depending on a control signal at the at least one control input. Preferably, the at least one control input is connected to the charging and discharging controller, such that the switching device can be controlled based on control signals from the charging and discharging controller. One terminal of the first resistor is connected to the first input of the switching device, while a terminal of the second resistor is connected to the second input of the switching device. In this constellation, the second terminal of the first resistor can be connected to a voltage source and the second connection of the second resistor can be connected to ground potential. The output of the switching device would be connected to a terminal of the capacitor. The capacitor could thus be connected to a voltage source (and thus charged) via the first resistor, or it could be connected to ground via the second resistor (and thus discharged). In this way, the capacitor can be charged and discharged based on control signals from the charging and discharging device.

Furthermore, measurement signals $U_d$ with a descending characteristic curve can simply be linearized using the same switching principle. The capacitor only needs to be charged to a higher starting value in the "discharging phase" described so far. In the "charging phase", the capacitor is then discharged to a lower voltage. To generate a correct reset pulse for the flipflop, the two inputs of the comparator may be switched, for example. It would also be conceivable to invert the output of the comparator using a suitable inverter.

In addition, the capacitor could be of a temperature-stable design to achieve improved temperature stability. The capacitor may include a temperature coefficient α, having a value that is less than $10^{-3}/K$, or less than $10^{-4}$ per Kelvin. In a further embodiment, the temperature coefficient α equals 0. A respective capacitor having a temperature coefficient of 0 is for example a class 1 ceramic capacitor according to IEC/EN 60384-8/21, which is also known as NP0 (negative positive zero) capacitor. In terms of the EIA RS-198 codes such a capacitor would be called C0G.

The square-wave signal generated by the linearization circuit according to an embodiment is already representative of a linearized output signal. This is because the square-wave signal is a pulse width modulated signal, i.e. the ratio between a high level and the period length of the square-wave signal is representative of the linearized output signal. If the linearized output signal is to be present in the form of a direct voltage, the linearization circuit may in a further embodiment include a low pass filter to which the square-wave signal is applied. The low pass filter would generate a direct voltage from the square-wave signal which is derived from the square-wave signal. In an embodiment design of the low pass filter, said filter may be formed by a simple RC element. To prevent the output signal from being influenced by temperature variation, the low pass filter could be formed by temperature-stable elements.

The preceding statements and explanations show that the linearization circuit according to an embodiment and its respective further developed embodiments can do without the use of special components. This results in no limitation with respect to resolution of the linearization circuit by digitization stages, such as analog-to-digital converters. The circuit can instead be implemented using a few discreet components and simple integrated circuits. The resolution of the circuit is to a great extent limited only by the noise from each component, which is typically clearly below the quantization noise of common analog-to-digital converters. This helps create a cost-efficient and reliable linearization circuit with a high precision and resolution.

The components of the linearization circuit may also be implemented in a microcontroller to increase flexibility. This may be implemented, for example, for the charging and discharging controller. In this way, charging and discharging the capacitor can be configured to be flexibly programmable. Such a microcontroller could also be used to control an adjustable first resistor or an adjustable resistor connected in parallel or in series to said first resistor—if present. Such components are known from practice. The microcontroller could also be used to analyze the square-wave signal outputted by the comparator circuit. This could for example be done by counting reference oscillations, such as the clock signal of the microcontroller. This allows easy and cost-efficient digitization of the linearized output signal, in which any desired resolution can be achieved through longer counting phases. In addition, the microcontroller can generate voltages which may be needed for charging or discharging the reference component. PWM modules of the microcontroller could be used to this end together with an external low pass filter. All in all, it is evident that many parts of the linearization circuit can in principle be implemented in a microcontroller.

There are various ways of advantageously developing and improving the rationale of this disclosure. We refer to the claims that are subordinate to the dependent claims and the explanation of various embodiments with reference to the figure. Designs and improvements of the teaching are described in conjunction with explaining an embodiment based on the drawing. Wherein:

Figure 1:
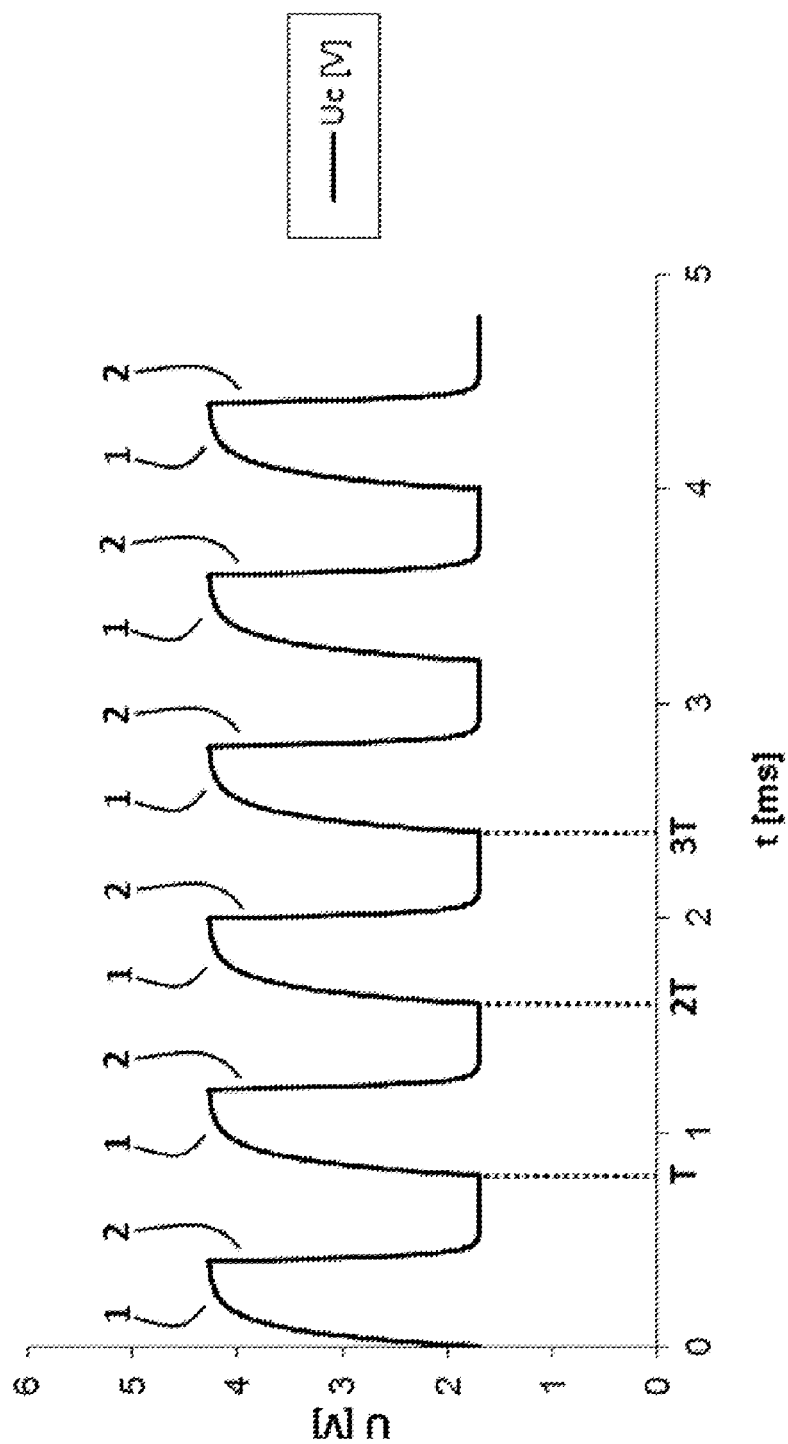
FIG. 1 shows a diagram of an exemplary curve of a reference signal which is constructed of a sequence of charge-discharge cycles of a capacitor.

FIG. 1 shows a diagram with a temporal progression of a reference signal which can be generated and used by a linearization circuit according to an embodiment. The diagram is a plot of a voltage $U_c$ over a time t. The reference signal is constructed by a sequence of charging and discharging phases of a capacitor of the linearization circuit. A temperature-stable capacitor (e.g., a C0G or NP0) is constantly charged and discharged. Said capacitor is charged via a temperature-stable first resistor and follows a typical capacitor charging curve. It is discharged via a second resistor in such a manner that discharging is faster than charging, such that the stable initial state is reached again very fast. The discharging resistor—second resistor—does not have to meet any special precision or temperature-stability requirements.

A charging phase 1 of the capacitor is followed by a discharging phase 2 of the capacitor or vice versa. After a period length T, a new charging phase and thus a new charge-discharge cycle is started, i.e. the charging and discharging of the capacitor is controlled such that a periodic reference signal with a period length T is generated. In the exemplary embodiment shown in FIG. 1, this period is approx. 0.8 ms. It is evident that the charging and discharging phases change after about half a period length. Not the entire discharging phase is needed for discharging the capacitor. This ensures that the capacitor is really discharged at the start of a new charging phase and thus at the start of a new charge-discharge cycle.

The linearization circuit includes a comparator circuit which in the exemplary embodiment shown herein includes a comparator and a D flipflop. The comparator compares the reference signal $U_c$ with the measurement signal $U_d$. The measurement signal $U_d$ is the already converted direct voltage which depends on a measured physical variable. The flipflop is set at the start of each charging phase, whereby its initial voltage $U_a$ is set to logic "1", i.e. takes a high level. If the reference signal $U_c$ becomes greater than the measurement signal $U_d$, the comparator switches and sets the flipflop back to logic "0", i.e. to a low level.

Figure 2:
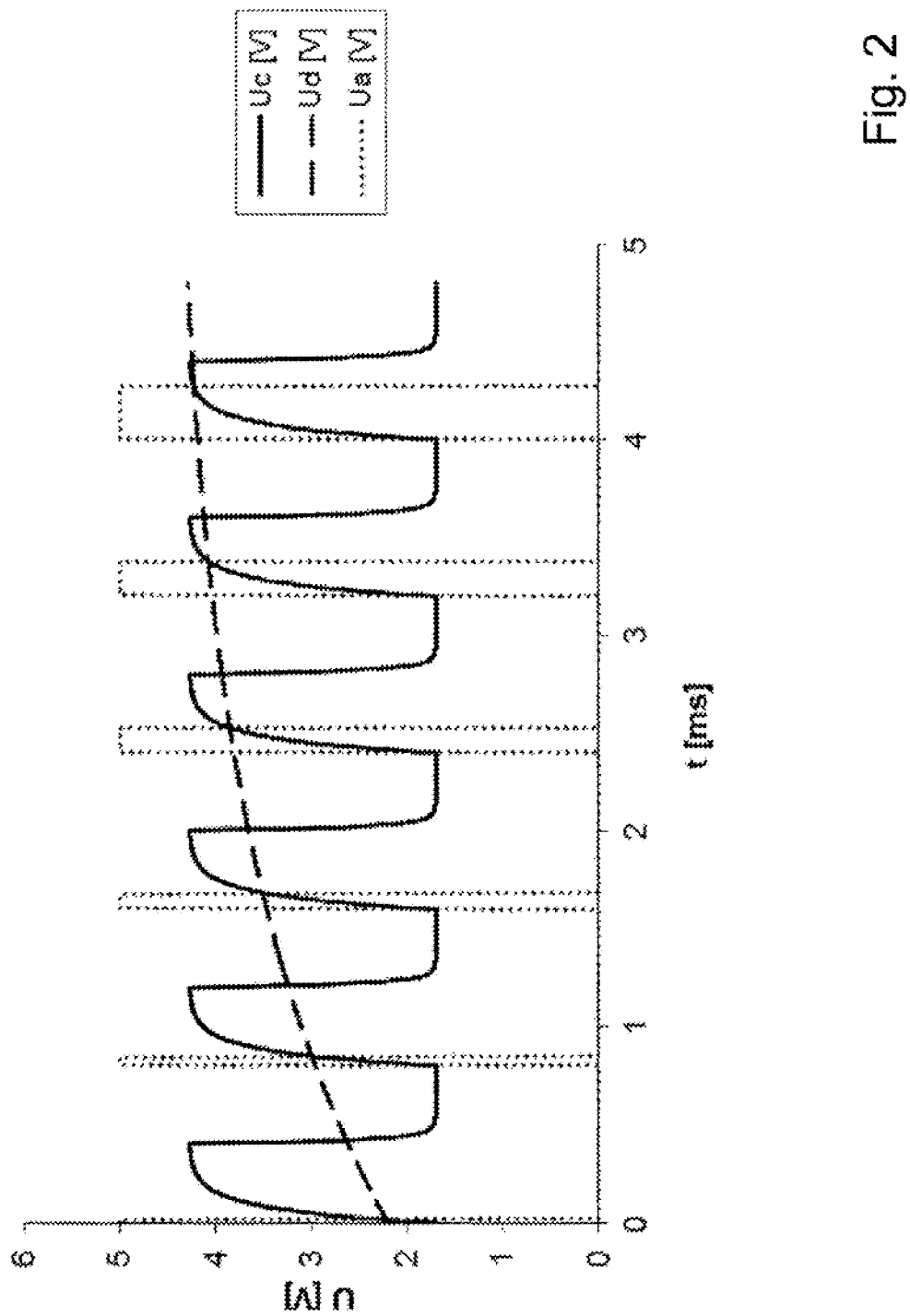
FIG. 2 shows a diagram with the reference signal according to FIG. 1 together with a measurement signal $U_d$ and a square-wave signal $U_a$.

FIG. 2 shows, in addition to the reference signal $U_c$ according to FIG. 1, a time progression of a measurement signal $U_d$ and a square-wave signal $U_a$, which is generated by the linearization circuit. It is assumed for the measurement signal $U_d$ shown that the physical variable which is represented by the measurement signal $U_d$ changes linearly. This implies that the measurement signal $U_d$ rises according to the characteristic curve of the sensor which generated this measurement signal.

Figure 2A:
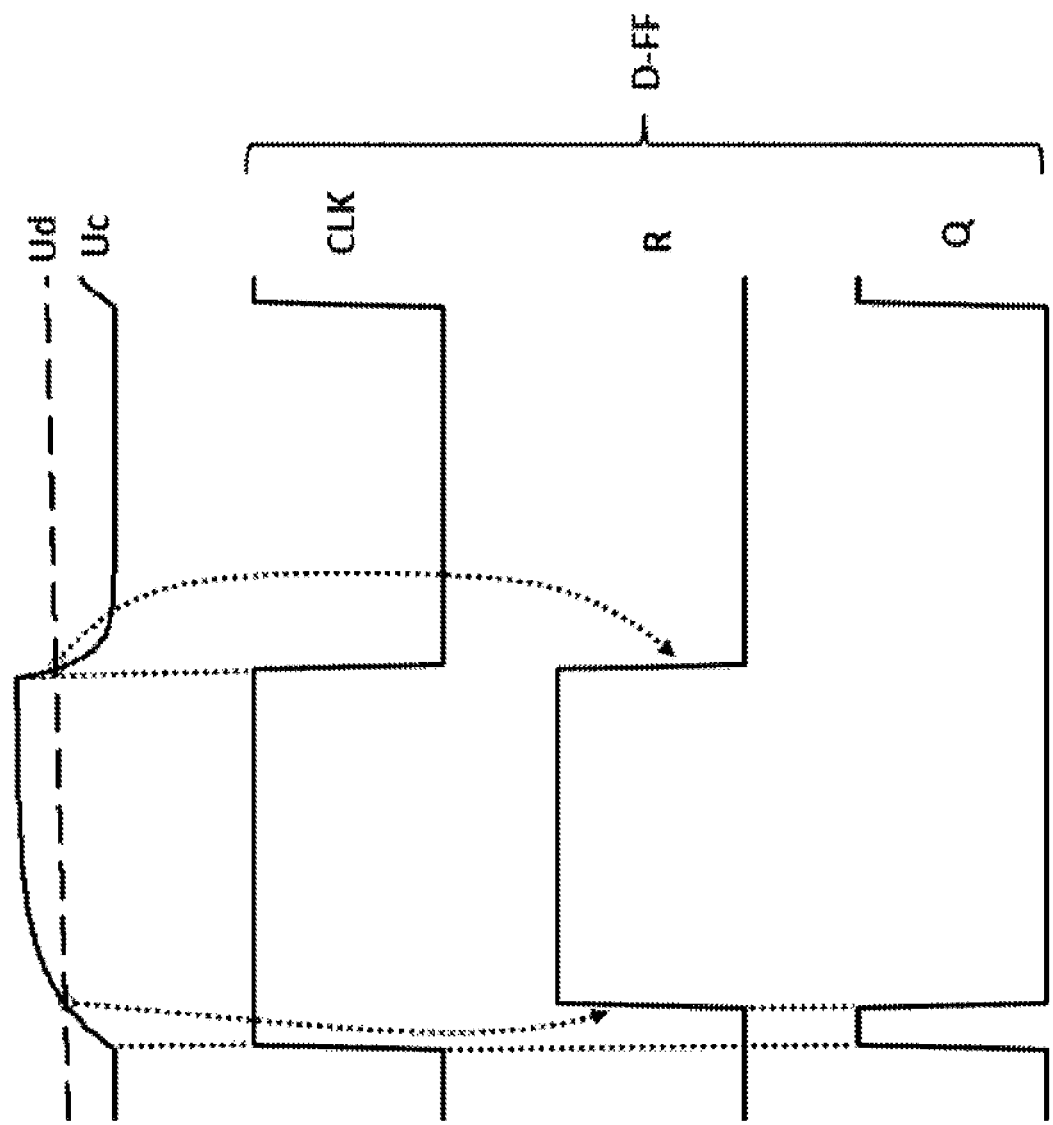
FIG. 2a shows a diagram with the reference signal $U_c$ and the measurement signal $U_d$ together with the clock signal CLK, a signal on the reset input of a D flipflop, and a signal at the output Q of the D flipflop.

FIG. 2a shows the time progression of reference signal $U_c$ and measurement signal $U_d$ and the associated level states at a D flipflop. The clock signal controls—as described above—the emergence of the curve $U_c$ in that a capacitor is charged when switching to high level and discharged again when switching to low level. At the same time, the clock signal is applied to the CLK input of the D flipflop. If the D input of the flipflop is always on logic "1" (high level), the output Q with the rising edge is set by the clock signal. The comparator constantly compares $U_d$ and $U_c$. If $U_d$ is greater than $U_c$, the output of the comparator jumps from 0 to 1. This output signal is fed to the R input of the flipflop and causes the flipflop to be reset. Output Q thus switches to logic 0 (low level). The duration of the high level at the Q output of the D flipflop also depends on a reference time and a result of a comparison of measurement signal and reference signal, and thus represents the linearized measurement signal.

Figure 3:
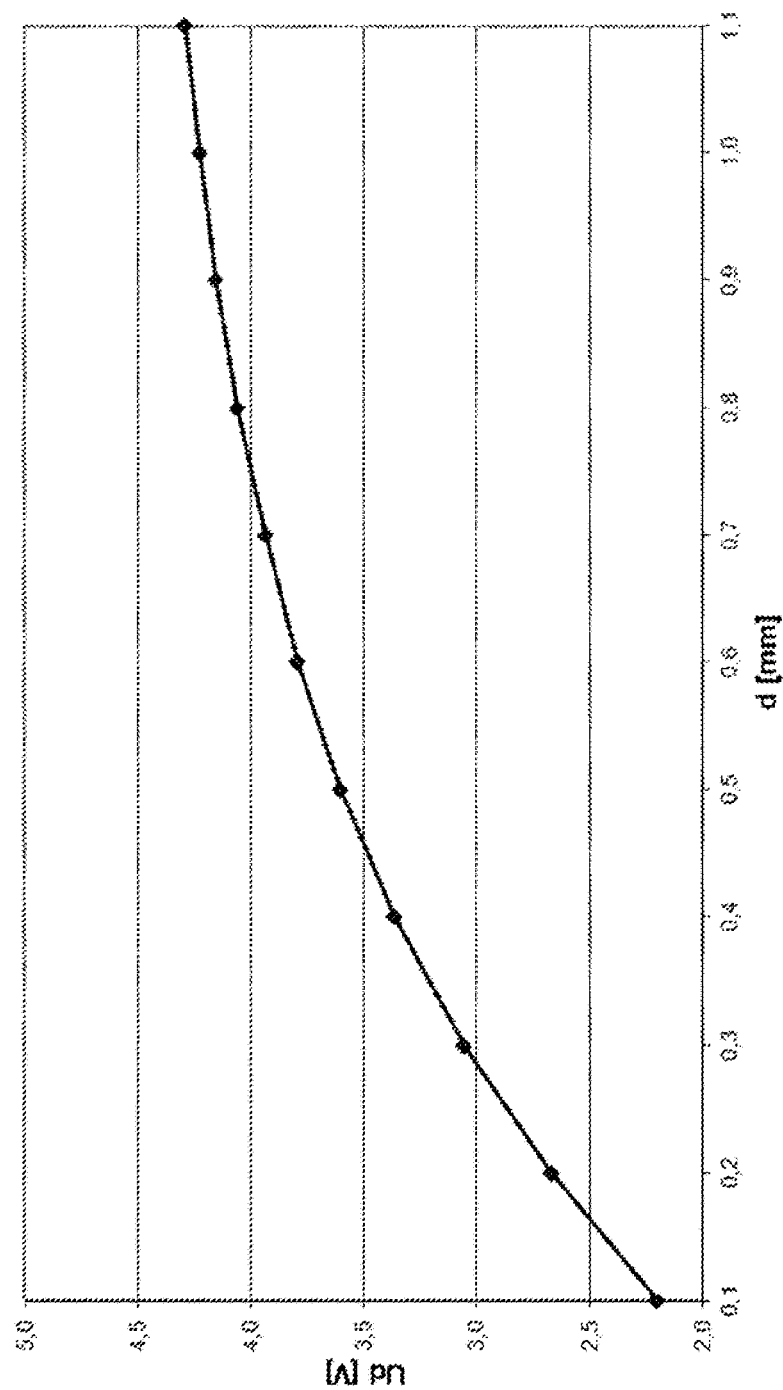
FIG. 3 shows a diagram with an exemplary measurement signal.

The characteristic curve of the sensor is completely shown in FIG. 3. The sensor is an eddy current measuring system, which determines the distance of a measured object from the measuring system. Accordingly, the measurement signal $U_d$ is plotted over the measured distance d in FIG. 3. It is visible that the sensitivity of the measurement system increases at a small measuring distance, and the characteristic curve therefore rises quickly. As the distance increases, sensitivity decreases, which is noticeable by a flatter characteristic curve. An exponential curve results for the measurement signal $U_d$ depending on the distance d. If the characteristic curve is completely traveled during a measurement (i.e. the distance from the start of the measuring range to the end of the measuring range is constantly increased), the exponentially rising curve $U_d$ shown in FIG. 2 is obtained as a time-dependent curve.

To compensate for the flattening curve towards the end of the measuring range, the measurement signal $U_d$ is compared to an exponential alternating voltage $U_c$, and a square-wave signal $U_a$ is generated. As the measurement signal flattens, the flipflop is reset later and later, which compensates for the flattening curve of the measurement signal by longer pulses. The pulse width (logic "1" of the flipflop) thus increases as the distance increases. Therefore the pulse width is a direct measure of the measure original variable, which has been linearized by the linearization circuit. If the square-wave signal is applied to a low pass filter, e.g. a simple RC element, a linear output voltage is obtained associated with the original output variable. Linearization thus takes place in that the voltage contributions to the characteristic curve are reduced in the range of high sensitivity (narrower pulse width) and increased in the range of low sensitivity (wider pulse width).

This behavior is evident in FIG. 2. A pulse of the square-wave signal always starts with a charging phase. Accordingly, the square-wave signal $U_a$ jumps from a low level (about 0 V) to a high level (about 5 V) at the beginning of a charging phase (identifiable by the beginning rise of the reference signal $U_c$). Thus the start of a charging phase forms a reference time during a charge-discharge cycle. The square-wave signal stays on a high level until the reference signal $U_c$ has the same size as the measurement signal $U_d$. Then the square-wave signal $U_a$ drops to a low level and stays there until a new charge-discharge cycle is started. It is also clearly visible that the pulse width changes as the measurement signal increases.

Figure 4:
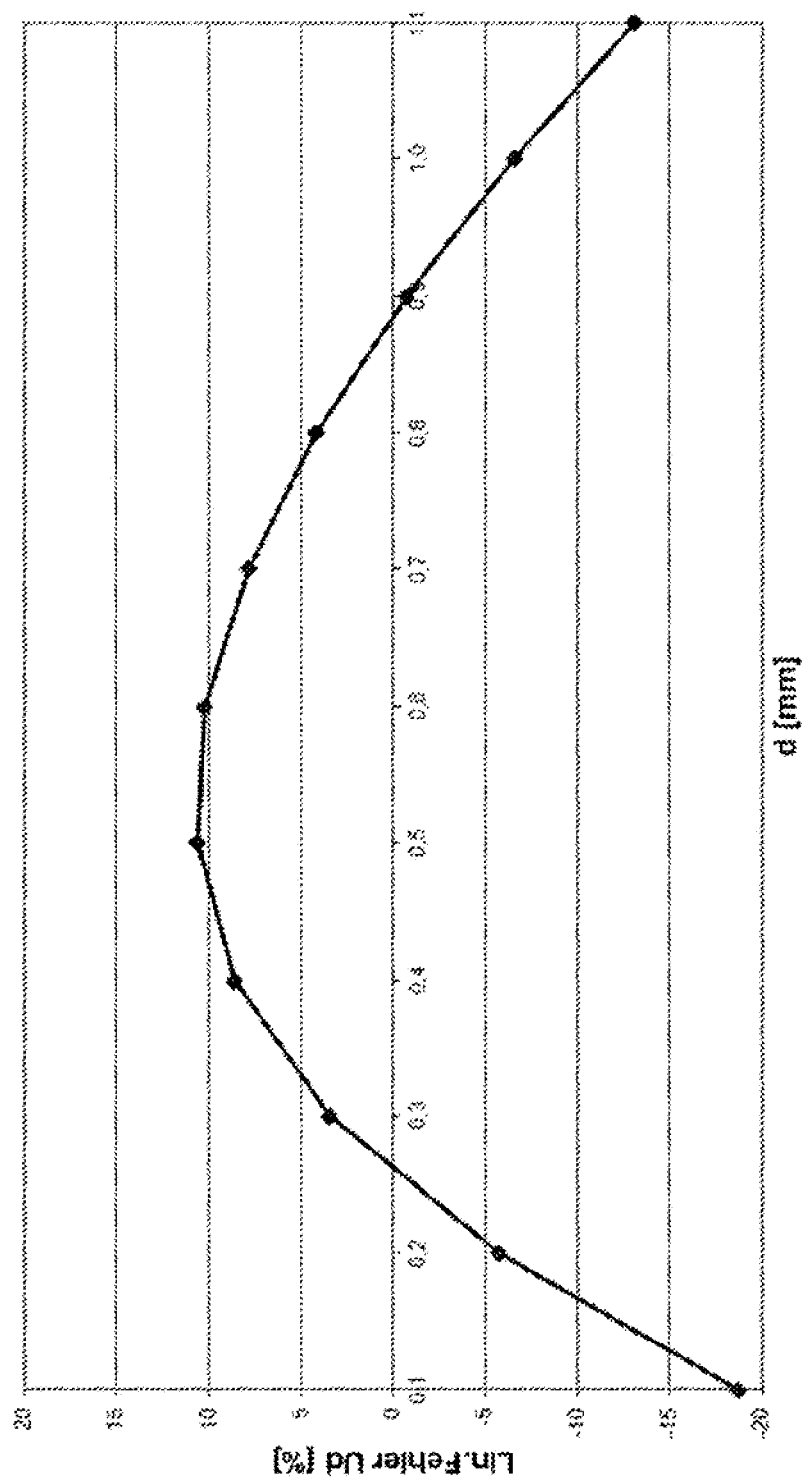
FIG. 4 shows a diagram with the linearization error of the measurement signal according to FIG. 3.
Figure 5:
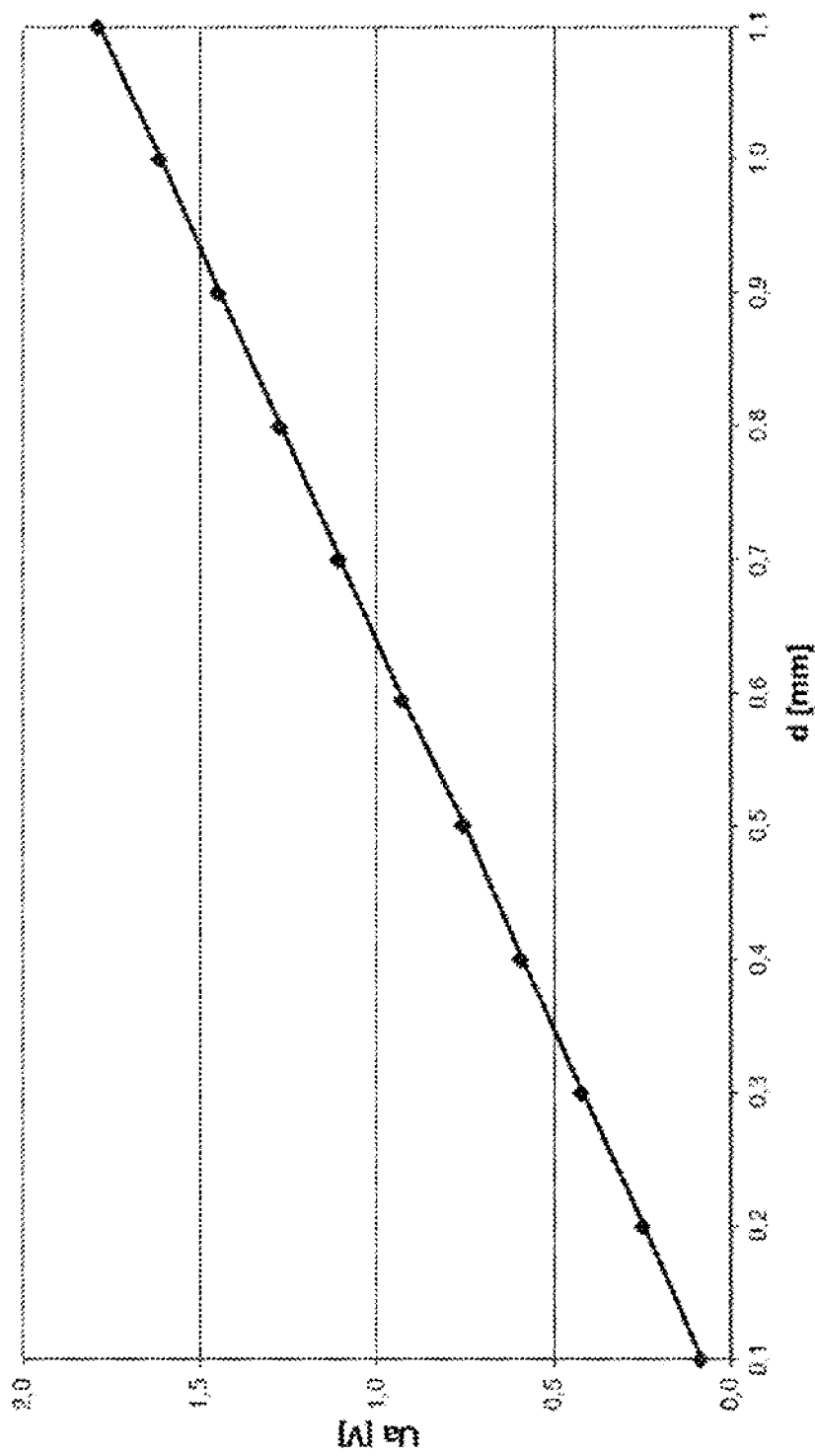
FIG. 5 shows a diagram with the linearized output signal of the linearization circuit according to an embodiment, wherein the output signal is equalized by a low pass filter.
Figure 6:
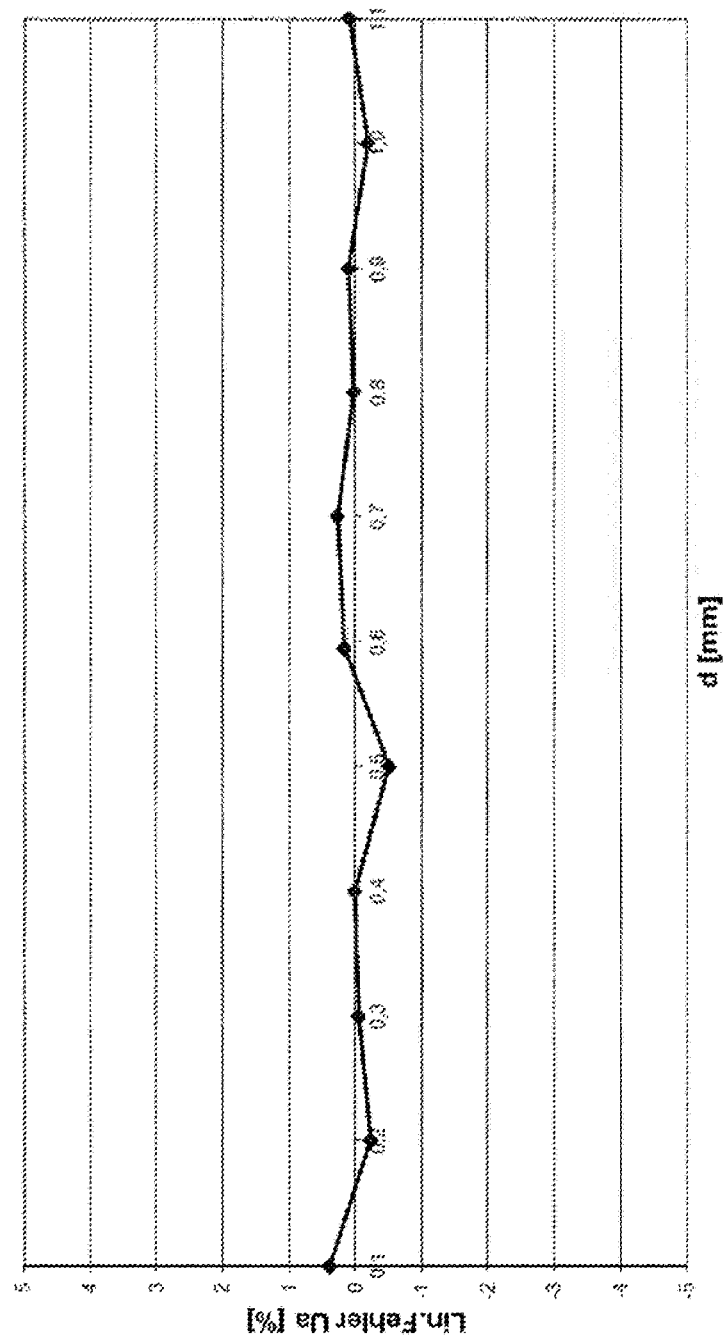
FIG. 6 shows a diagram with the linearization error of the linearized output signal.

The success of the linearization circuit will now be viewed in detail based on FIGS. 4 to 6. FIG. 4 shows the linearization error in percent for the characteristic curve according to FIG. 3. It can be seen that the measurement signal $U_d$ clearly deviates from a linear characteristic curve. The characteristic curve deviates from a linear characteristic curve by more than ±10%.

FIG. 5 shows a characteristic curve linearized using a linearization circuit according to an embodiment. It is evident from FIG. 5 that the output voltage $U_a$ of the linearization circuit deviates little from a straight line. FIG. 6 illustrates this once again in the form of the linearization error of the linearized output signal. It can be seen that the linearization error is considerably reduced. Most values are in a band of approximately ±0.5%. This is a very significant reduction compared to the approximately 20% in FIG. 4.

Figure 7:
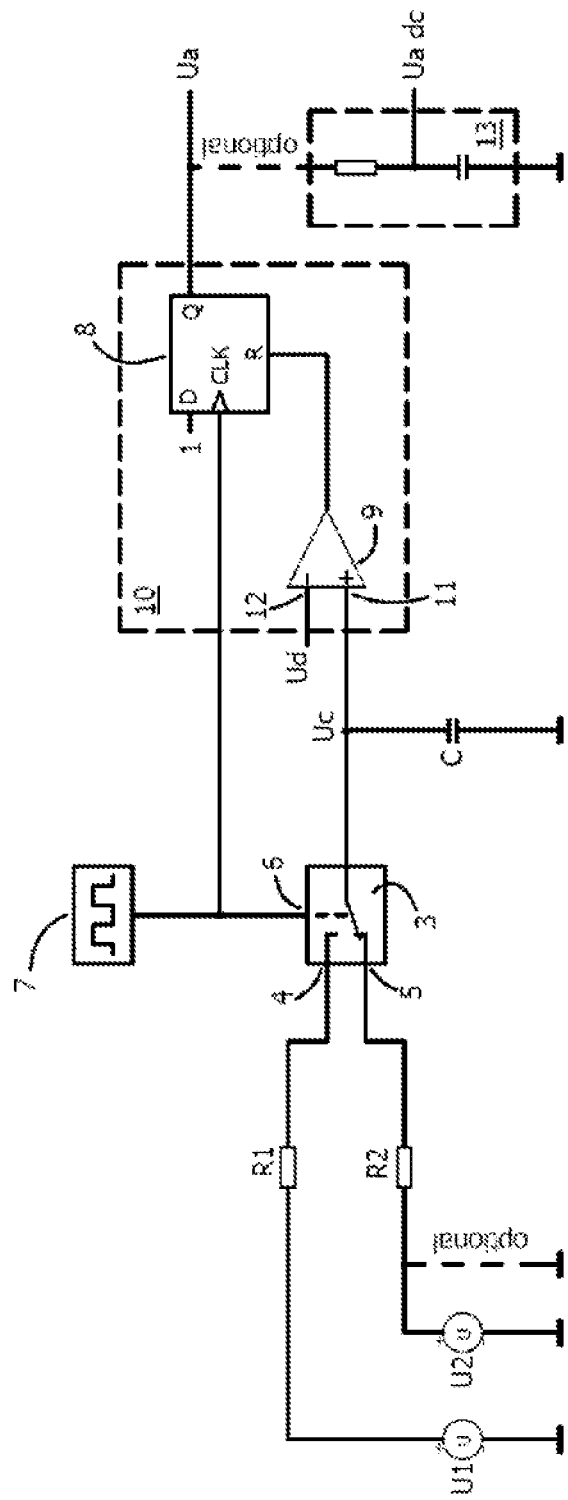
FIG. 7 shows an exemplary circuit for linearizing a measurement signal using a capacitor as reference component.

FIG. 7 shows a first embodiment of a linearization circuit according to an embodiment, wherein this first embodiment uses a capacitor C as reference component. The capacitor C has a very small temperature coefficient and may be a NP0 capacitor. One terminal of the capacitor C is connected to the output of a switching device 3, while the second terminal is connected to ground potential. The switching device 3 includes a first input 4, a second input 5, and a control input 6, wherein the switching device connects either the first input 4 or the second input 5 to the output, depending on the signal at the control input 6. A first voltage source U1 is applied to the first input 4 across a first resistor R1. The first resistor R1 is configured as a temperature-stable resistor. The second input 5 is connected via a second resistor R2 to a second voltage source U2. The voltage of the first voltage source U1 is greater than the voltage of the second voltage source U2. In principle, it is also conceivable that the second voltage source U2 is not provided and the second input of the switching device is connected to ground via the resistor R2. The optional design is outlined by a dashed line next to the second voltage source U2.

The control input 6 of the switching device 3 is connected to a clock-pulse generator 7, such that the clock-pulse generator 7 is used as a charging and discharging controller as defined by various embodiments. The output signal of the clock-pulse generator 7 is additionally inputted into the clock input CLK of a D flipflop 8, which forms a comparator circuit 10 together with a comparator 9. A high level is applied to the data input D of the flipflop 8. The reset input R is connected to the output of the comparator 9. A square-wave signal $U_a$ which represents the linearized measurement signal is output at the output Q of the flipflop 8. A first input 11 of the comparator 9 is connected to the capacitor C and the output of the switching device. The measurement signal $U_d$ is inputted into a second input 12 of the comparator 9. The output of the flipflop 9 may be connected to a low pass filter 13, which is outlined in dashed lines as an optional addition in FIG. 7 and formed by a resistor and a capacitor connected in series. An equalized linearized output signal $U_{a,dc}$ is applied to the interface of resistor and capacitor.

When this circuit is in operation, the clock-pulse generator 7 ensures together with the switching device 3 that the capacitor C is constantly charged and discharged. Since the control signal has a periodic design, the voltage across the capacitor C also has a periodic curve, which substantially matches the curve shown in FIG. 1. The period length T is defined by the period length of the output signal of the clock-pulse generator 7. The voltage across the capacitor C in this circuit forms the reference signal $U_c$. We make reference to our above explanations for further details of the operation of the circuit.

Figure 8:
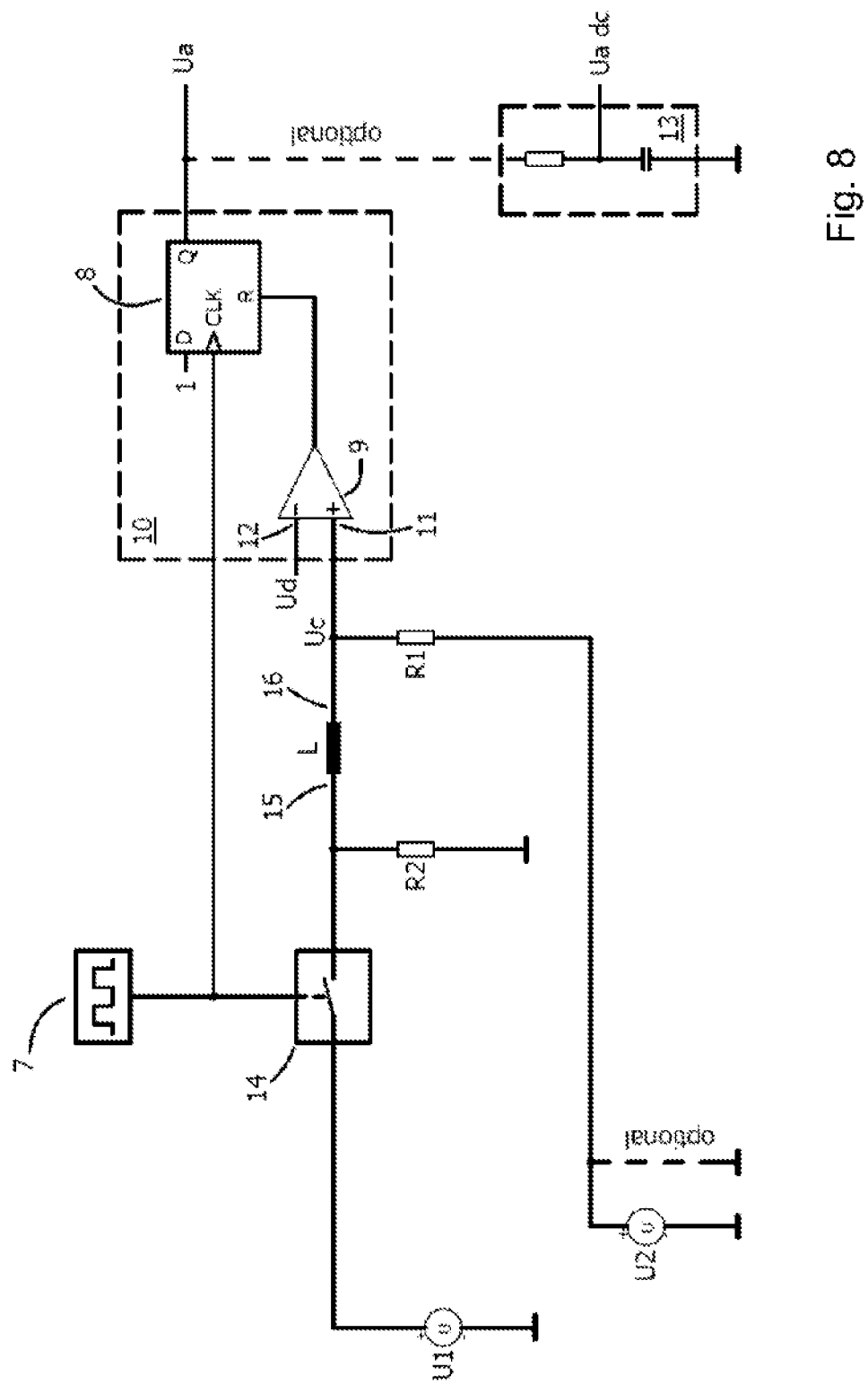
FIG. 8 shows an exemplary circuit for linearizing a measurement signal using a coil as reference component.

FIG. 8 shows a second embodiment of a linearization circuit according to an embodiment, wherein this second embodiment uses a coil L as reference component. The comparator circuit 10, the clock-pulse generator 7, and the optional low pass filter 13 are connected as in the first embodiment. Just the generation of the reference signal differs significantly. A switching device 14, which may be configured as a normally closed or normally open contact, is inserted between a voltage source U1 and a first terminal of the coil L. The control input of the switching device 14 is connected to the output of the clock-pulse generator 7. A second resistor R2, whose second terminal is connected to ground, is in addition connected to the first terminal of the coil L. A first resistor R1, whose second terminal is connected to a second voltage source or (optionally) to ground, is connected to a second terminal 16 of the coil L. The voltage at the second terminal 16 of the coil L is inputted in the second input 12 of the comparator 9.

When the circuit is in operation, the control signal at the control input of the switching device 14 ensures that the coil L is periodically charged and discharged. By closing the switching contact of the switching device 14, the first terminal 15 of the coil L is connected to the voltage source U1 and thus raised to a higher potential. This results in a current flowing through the coil L and the resistor R1, wherein the coil L is energized. After opening the switching contact of the switching device 14, the coil L is discharged via resistor R2 and resistor R1. This creates a voltage drop across the resistor R1, which drop is dependent on the current flow through the coil. This voltage drop is used to generate a reference signal. If a second voltage source U2 is provided, the voltage drop across the resistor R1 forms the alternating component of the reference signal. If optionally a connection to ground (instead of to the second voltage source U2) is provided, the voltage drop across the resistor R1 forms the reference signal. Otherwise, the circuit displays the behavior described above.

Even though the preceding explanations refer to moving through the entire characteristic curve of the sensor system, a person skilled in the art will see that a stationary measurement signal can also be linearized by the circuit. It is also not absolutely necessary that the output signal $U_a$ is converted into a direct voltage by a low pass filter. Instead, the pulse width of the square-wave signal can also be analyzed directly, for example using a counter. The respective measured value would then be obtained in digital form right away.

The circuit can be implemented using a microcontroller. The microcontroller can control clock generation, switching of the capacitor between charging and discharging phases, and optionally the flipflop. Furthermore, a DA converter, which may optionally be included in the microcontroller, can be used to adjust the circuit to real sensors by adjusting the resistance value of the temperature-stable first resistor using the DA converter, which is connected in parallel. This makes adjustment of real sensors controlled by the microcontroller fast and easy.

It should be emphasized that, despite using a microcontroller, the resolution of the linearization circuit does not depend on digital components such as an AD converter or DA converter of the microcontroller. According to an embodiment, only analog components (comparator) may be used to perform a comparison of the signals $U_c$ and $U_d$, such that the resolution is only limited by the noise of these components. As such, a simple and low-cost microcontroller can be used, since it only performs control tasks. The other components of the circuit are simple, passive components, which allows the implementation of a very low-cost, very easily digitally adjustable circuit with a high precision and resolution. Also, only very few temperature-stable components are needed, which has a further positive effect on the costs.

For further advantageous embodiments of the device according to an embodiment and to avoid repetition, see the general part of the description above and the appended claims.

Finally, it should be expressly noted that the exemplary embodiments of the linearization circuit according to embodiments described above are only used to explain the claimed teachings but do not limit these teachings to these exemplary embodiments.

LIST OF REFERENCE SYMBOLS $U_a$ Square-wave signal
$U_c$ Reference signal
$U_d$ Measurement signal
$U_{a,dc}$ Equalized square wave voltage $U_a$
1 Charging phase
2 Discharging phase
3 Switching device
4 First input (of the switching device)
5 Second input (of the switching device)
6 Control input (of the switching device)
7 Clock-pulse generator
8 D flipflop
9 Comparator
10 Comparator circuit
11 First input (of the comparator)
12 Second input (of the comparator)
13 Low pass filter
14 Switching device
15 First terminal (of the coil)
16 Second terminal (of the coil)

The invention claimed is:

1. A linearization circuit configured to linearize a measurement signal ($U_d$), the linearization circuit comprising:
   an input configured to receive the measurement signal ($U_d$) and an output configured to provide a linearized output signal;
   a reference circuit component having a non-linear dependence on current or voltage, wherein a voltage across the reference circuit component, or a voltage derived from a current flowing through the reference circuit component, forms a reference signal ($U_c$) or an alternating component of a reference signal ($U_c$);
   a charging and discharging controller configured to control alternating charging and discharging of the reference circuit component, wherein the charging and discharging are controlled so that the reference signal ($U_c$) has a substantially periodic time dependence; and
   a comparator circuit having a first comparator input, a second comparator input, and a comparator output,
   wherein, the comparator circuit is configured to generate, and to provide to the comparator output, a square-wave signal ($U_a$), when the reference signal ($U_c$) is provided to the first comparator input and the measurement signal ($U_d$) is provided to the second comparator input, the square-wave signal ($U_a$) being generated based on a reference time during a charge-discharge cycle and a result of a comparison of the reference signal ($U_c$) with the measurement signal ($U_d$), such that the square-wave signal ($U_a$) represents the linearized output signal.

2. The linearization circuit of claim 1, wherein the comparator circuit further comprises a comparator and a flipflop,
   wherein the comparator is configured, to compare the signals received by the first and second comparator inputs, to generate a result of the comparison, and to provide the result of the comparison to the flipflop, and
   wherein the flipflop is configured to generate the square-wave signal ($U_a$) and to provide the square-wave signal ($U_a$) as output via the comparator output.

3. The linearization circuit of claim 2, wherein the comparator is configured as a Schmitt trigger, such that the comparator is configured to output a low level when the reference signal ($U_c$) is less than the measurement signal ($U_d$), and to output a high level when the reference signal ($U_c$) is greater than the measurement signal ($U_d$).

4. The linearization circuit of claim 2, wherein the flipflop is an RS flipflop having a set input (S) and a reset input (R),
   wherein the set input (S) is connected to the charging and discharging controller, and
   wherein the flipflop is configured with the charging and discharging controller such that the flipflop is set at the start of a charging process of the reference circuit component.

5. The linearization circuit of claim 2, wherein the flipflop is a D flipflop having a data input (D), a clock input (CLK), and a reset input (R),
   wherein the data input (D) is on a high level and the clock input (CLK) is connected to the charging and discharging controller, and
   wherein the flipflop is configured with to the charging and discharging controller such that the flipflop is set at the start of a charging process of the reference circuit component.

6. The linearization circuit of claim 2, wherein the flipflop is either an RS flipflop having a set input (S) and a reset input (R), or the flipflop is a D flipflop having a data input (D), a clock input (CLK), and a reset input (R),
   wherein, when the flipflop is an RS flipflop:
      the set input (S) is connected to the charging and discharging controller; and
      the flipflop is configured with the charging and discharging controller such that the flipflop is set at the start of a charging process of the reference circuit component, wherein, when the flipflop is a D flipflop:
      the data input (D) is on a high level and the clock input (CLK) is connected to the charging and discharging controller; and
      the flipflop is configured with the charging and discharging controller such that the flipflop is set at the start of a charging process of the reference circuit component, and
   wherein the comparator and the flipflop are configured such that the result of the comparison provided by the comparator output is provided to a reset input (R) of the flipflop.

7. The linearization circuit of claim 1, wherein the comparator circuit further comprises a comparator and an AND gate,
   wherein the comparator and the AND gate are configured such that:
      the comparator is configured to compare the signals received by the first and second comparator inputs;
      the comparator is configured to provide a result of the comparison to the AND gate, and
      the AND gate is configured to generate the square-wave signal ($U_a$) and to provide the square-wave signal ($U_a$) as output via the comparator output.

8. The linearization circuit of claim 1, further comprising:
   a first resistor (R1); and
   a second resistor (R2),
   wherein the reference circuit component is configured to be charged via the first resistor (R1) and discharged via the second resistor (R2).

9. The linearization circuit of claim 8, wherein the first and second resistors (R1, R2) are configured such that discharging the reference circuit component is faster than charging the reference circuit component.

10. The linearization circuit of claim 8, wherein the first resistor (R1) is configured to be adjusted, or the linearization circuit further comprises an adjustable resistor that is connected in parallel or in series to the first resistor (R1).

11. The linearization circuit claim 1, further comprising:
a switching device having at least one control input,
wherein the at least one control input is connected to the charging and discharging controller, and
wherein the switching device connects a terminal of the first resistor (R1) or a terminal of the second resistor (R2) to a terminal of the reference circuit component based on a control signal provided to the at least one control input.

12. The linearization circuit claim 1, wherein the reference circuit component further comprises a coil (L) or a capacitor (C).

13. The linearization circuit of claim 12, wherein the capacitor (C) or the coil (L) has a temperature coefficient α having a value that is less than approximately $10^{-3}$/K.

14. The linearization circuit claim 1, further comprising:
a low pass filter configured to receive the square-wave signal ($U_a$),
wherein the low pass filter is configured to generate a direct voltage ($U_{a,dc}$) from the square-wave signal ($U_a$).

15. The linearization circuit claim 1, further comprising:
a microcontroller in which the charging and discharging controller and/or other parts of the linearization circuit are implemented.

16. The linearization circuit claim 1, wherein the reference circuit component is configured to be adjustable to thereby adjust charging and discharging behavior.

17. A method of linearizing a measurement signal, the method comprising:
receiving, by a linearization circuit, a measurement signal ($U_d$), wherein the linearization circuit includes a reference circuit component, a charging and discharging controller, and a comparator circuit, the comparator circuit having a first comparator input and a second comparator input;
alternating charging and discharging of the reference circuit component to thereby generate a reference signal ($U_c$), which depends on a voltage provided to the reference circuit component, or the reference signal ($U_c$) depending on a current flowing through the reference circuit component, wherein the charging and discharging of the reference circuit component is controlled such that the reference signal ($U_c$) has a periodic time dependence;
providing the reference signal ($U_c$) to the first comparator input of the comparator circuit;
providing the measurement signal ($U_d$) to the second comparator input of the comparator circuit;
generating, by the comparator circuit, a result of a comparison of the reference signal ($U_c$) with the measurement signal ($U_d$);
generating a square-wave signal ($U_a$) based on a reference time during a charge-discharge cycle and based on the result of the comparison of the reference signal ($U_c$) with the measurement signal ($U_d$); and
providing the square-wave signal ($U_a$) from the linearization circuit as a linearized output signal.

18. The method according to claim 17, further comprising:
using a start time of charging the reference circuit component as a reference time during a charge-discharge cycle.

19. The method according to claim 18, further comprising:
determining when the reference signal ($U_c$) is greater than the measurement signal ($U_d$);
after charging the reference circuit component by the comparator circuit is started, outputting a first level until the reference signal ($U_c$) is determined to be greater than the measurement signal ($U_d$); and
outputting a second level until a time of a subsequent start of charging the reference circuit component by the comparator circuit.

* * * * *